US010574028B2

(12) United States Patent
Wei et al.

(10) Patent No.: US 10,574,028 B2
(45) Date of Patent: Feb. 25, 2020

(54) DIGITALLY INTEGRATED SELF-TRAINED PRE-DISTORTION CURVE FINDER FOR LINEARLY FREQUENCY SWEPT SEMICONDUCTOR LASER SYSTEMS

(71) Applicant: Rhode Island Council on Postsecondary Education, Warwick, RI (US)

(72) Inventors: Tao Wei, West Kingston, RI (US); Zheyi Yao, Kingston, RI (US); Yan Sun, Kingston, RI (US)

(73) Assignee: Rhode Island Council on Postsecondary Education, Warwick, RI (US)

( * ) Notice: Subject to any disclaimer, the term of this patent is extended or adjusted under 35 U.S.C. 154(b) by 0 days.

(21) Appl. No.: 16/285,738

(22) Filed: Feb. 26, 2019

(65) Prior Publication Data
US 2019/0190234 A1      Jun. 20, 2019

Related U.S. Application Data

(63) Continuation-in-part of application No. 15/656,255, filed on Jul. 21, 2017, now Pat. No. 10,224,694.

(51) Int. Cl.
*H01S 5/062* (2006.01)
*H01S 5/042* (2006.01)
*H01S 5/0683* (2006.01)
*H01S 5/068* (2006.01)
*H01S 5/06* (2006.01)

(52) U.S. Cl.
CPC .......... *H01S 5/06223* (2013.01); *H01S 5/042* (2013.01); *H01S 5/0617* (2013.01); *H01S 5/0683* (2013.01); *H01S 5/06817* (2013.01)

(58) Field of Classification Search
CPC .......... H01S 5/062–06258; H01S 5/068–0687; H01S 5/06223; H01S 5/06817; H01S 5/0617
See application file for complete search history.

(56) References Cited

U.S. PATENT DOCUMENTS

| 4,907,237 A * | 3/1990 | Dahnnani | H01S 5/0656 372/32 |
| 9,841,301 B2 * | 12/2017 | Wei | G01H 9/004 |
| 9,958,605 B2 * | 5/2018 | Wei | G02B 6/0208 |
| 2010/0085992 A1 * | 4/2010 | Rakuljic | G01D 5/266 372/20 |
| 2016/0254646 A1 * | 9/2016 | Li | H01S 3/0627 372/32 |

* cited by examiner

*Primary Examiner* — Xinning(Tom) Niu
*Assistant Examiner* — Sean P Hagan
(74) *Attorney, Agent, or Firm* — Barlow, Josephs & Holmes; Stephen Holmes

(57) ABSTRACT

The present disclosure provides a unique digitally integrated, self-trained pre-distortion curve generation method and apparatus for semiconductor lasers (SCLs) to generate linearly swept optical signals that are applicable to a wide range of sweep velocities and semiconductor laser types. The method requires no prior knowledge of the frequency response of the laser and is highly accurate.

17 Claims, 15 Drawing Sheets

DIGITALLY INTEGRATED SELF-TRAINED PRE-DISTORTION CURVE FINDER FOR LINEARLY FREQUENCY SWEPT SEMICONDUCTOR LASER SYSTEMS

CROSS-REFERENCE TO RELATED APPLICATIONS

This application is a continuation-in-part of U.S. patent application Ser. No. 15/656,255, filed Jul. 21, 2017.

STATEMENT OF GOVERNMENT INTEREST

This invention was made with government support under Grant Nos. CCF1439011, CMMI1462656 and EAR1442623 awarded by the National Science Foundation. The government has certain rights in the invention.

BACKGROUND OF THE INVENTION

Field of the Invention

The instant invention generally relates to frequency-swept semiconductor laser sources, such as a sweep velocity locked laser pulse generator (SV-LLPG), and more particularly to a unique pre-distortion curve finder for tuning a semiconductor laser source.

Description of Related Art

At the core of frequency modulated optical sensing technologies is a coherent optical source, or laser, that can output linearly swept frequency as a function of time. Highly linear frequency-swept lasers have been attracting increasing attention due to their ability to make sensitive measurements with high spacial resolution using low power, eye-friendly semiconductor lasers.

Present applications for these types of frequency-swept lasers include tunable laser diode spectroscopy, also known as, frequency-modulated (FM) spectroscopy, optical frequency-modulated continuous-wave (FMCW) LiDAR, optical frequency domain reflectometer (OFDR)-based distributed optical fiber sensing, and optical fiber key technology for identification and physical security (FiberID), one of the physical unclonable function (PUF) technologies.

Each of these applications requires the use of lasers capable of generating a range of well-controlled output frequencies in order to make high-fidelity frequency domain measurements. Various laser frequency control techniques have been investigated in order to generate highly linear, well controlled frequency-swept outputs.

There are two basic categories of control systems that linearize the frequency sweep of the laser, which can be broadly characterized as either active or passive.

Methods of active laser control utilize closed feedback loops, specifically optical phase-locked loops (OPLLs), to capture the frequency or phase error of the laser frequency sweep velocity. The error signal is then used to modify the drive current of the laser to linearize the sweep velocity of the frequency-swept laser source.

Alternatively, methods of passive control utilize a pre-determined, ramp-like injection current to drive the laser output. Both active and passive methods fundamentally rely on a specifically tuned pre-distortion curve of their initial injection current in order to generate a constant sweep velocity and resulting linear frequency output. In the absence of a well-tuned initial pre-distortion curve, neither active or passive laser control methods are effective; thus, determining the parameters of a well-tuned pre-distortion curve is of central importance in electronically driven swept frequency lasers.

SUMMARY OF THE INVENTION

The present disclosure provides a unique digitally integrated, self-trained pre-distortion curve generation method and apparatus for semiconductor lasers (SCLs) to generate linear frequency-swept optical signals that are applicable to a wide range of sweep velocities and semiconductor laser types. The method and apparatus require no prior knowledge of the frequency response of the laser and are highly accurate.

The objective of the present method and device is to quickly find the pre-distortion curve of the laser in the form of digital data so that it can be used immediately by the laser driver (LD) at startup to generate a high-quality linearized optical sweep without delay.

A small portion of the laser output from a Semiconductor Laser (SCL) (or Laser Driver (DL) and SCL) is delivered into a Frequency Discriminator (FD) that converts the optical frequency sweep velocity into a radio frequency. The radio frequency created by the FD is converted into a digital signal through the use of a digitizer. The digitized signal is then fed into a Time-to-Digital Converter (TDC), which is able to generate the precise phase and frequency error between the digitized signal input, and the expected signal with a constant frequency.

The frequency and frequency error are then fed into a Central Controller (CC), which has two main functions. The first function is to generate a compensation signal to modify the pre-distortion curve through iterations, also known as training. The second function is to count the number of iterations.

The compensation signal is then summed up with a delayed version of pre-distortion curve from the previous training iteration via a digital adder. The newly modified pre-distortion curve is then written into a memory. The delayed version of the pre-distortion curve is captured through the use of a delay (DLY) compensator. The purpose of this delay compensator unit is to compensate the loop delay, including both analog and digital delay in the iteration/training loop. The length of delay, with a unit of number of system clock cycles, is pre-set into the DLY compensator before the training process.

A Digital to Analog Converter (DAC) reads data from the memory to generate a newly modified pre-distortion curve from the current iteration during the training process.

Each iteration of the feedback loop takes on 1 ms to complete, and a 1000 iterations, only 1 second, providing an almost instantaneous stable laser source.

The present pre-distortion curve finder can function as a stand-alone unit or can be integrated into swept-velocity locked laser pulse generators as also disclosed in various exemplary embodiments herein.

BRIEF DESCRIPTION OF THE DRAWINGS

While the specification concludes with claims particularly pointing out and distinctly claiming particular embodiments of the instant invention, various embodiments of the invention can be more readily understood and appreciated from the following descriptions of various embodiments of the invention when read in conjunction with the accompanying drawings in which:

DETAILED DESCRIPTION OF THE INVENTION

Figure 1:
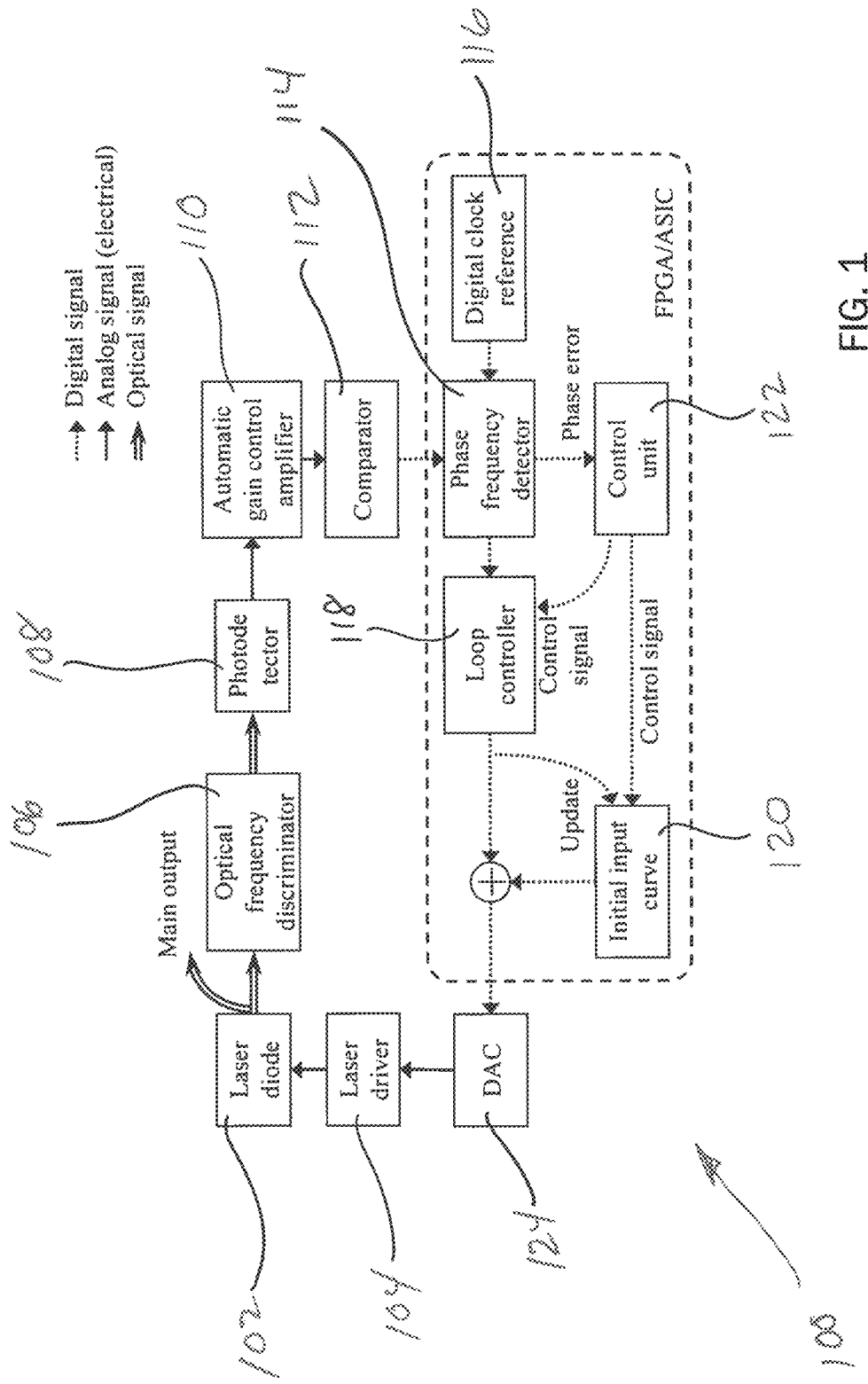
FIG. 1 is the exemplary architecture of digital sweep velocity-locked laser pulse generator (SV-LLPG)

Referring now to the drawings, FIG. 1 illustrates an exemplary architecture of a digital sweep velocity-locked laser pulse generator generally indicated at 100. A semiconductor laser diode 102, driven by a voltage-to-current driver 104, outputs a chirped laser pulse. The chirped pulse is sent into an optical frequency discriminator 106 to translate the frequency changing rate of the chirped input into a radio frequency (RF) signal and captured by a photodetector 108. This OFD device 106 is typically an optical interferometer or resonator with a fixed delay line, such as a Mach-Zehnder interferometer, Michelson interferometer, fiber ring resonator, etc. The frequency of this RF signal is linearly proportional to the sweep velocity of the chirped laser output. The RF signal is amplified through a transimpedance automatic gain control amplifier (AGC) 110 to compensate for the amplitude modulation associated with the chirped pulse. The AGC output, ideally with constant amplitude over time, is converted to a digital signal train, using a voltage comparator 112 with certain preset threshold voltage. A phase frequency detector (PFD) 114 is used to compare the phase between the digital signal produced by optical signal and a high precision digital clock reference signal 116. The phase error is fed into a loop controller 118, also known as loop filter. The summation of the control signal out of the loop controller 118 and an initial input curve unit 120 is fed into a digital-to-analog converter (DAC) 124 to generate driving voltage to drive the laser driver 104. A basic control loop is now formed to lock the sweep velocity of the chirped laser 102.

The majority of the control loop system, including digital clock reference 116, PFD 114, loop controller 118, and initial input curve unit 120, can be all integrated in a digital chip (represented within dashed line). This chip can be a field programmable gated array (FPGA) or an application specific integrated circuit (ASIC). A control unit 122 can be built inside this digital chip to achieve three functions stated below:

(a) The initial input curve is self-adaptive. It can be modified by directly adding the values of control signal from the loop controller 118 to the initial input curve, which is saved in a memory module in the chip. Two to three iterations are typically enough to find a sufficiently effective initial input curve, using this method.

Figures 2A, 2B:
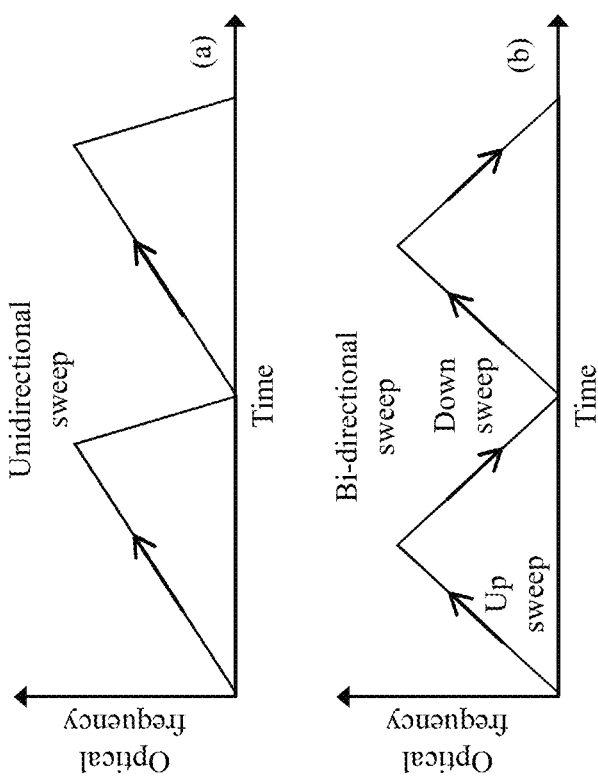
FIG. 2a is the optical frequency change as a function of time at the output of the SV-LLPG in unidirectional sweep mode.
FIG. 2b is the optical frequency change as a function of time at the output of the SV-LLPG in bidirectional sweep mode.

(b) FIGS. 2a and FIG. 2b depict optical frequency change as a function of time at the output of the SV-LLPG in unidirectional sweep mode and bi-directional mode, respectively. Unidirectional sweep mode only controls a single-sided chirp, i.e., either up sweep or down sweep, while bi-directional mode controls double-sided chirp, which is achieved by changing the sign of the loop controller output. These two modes are switched by the control unit, which is determined by user.

Figure 3:
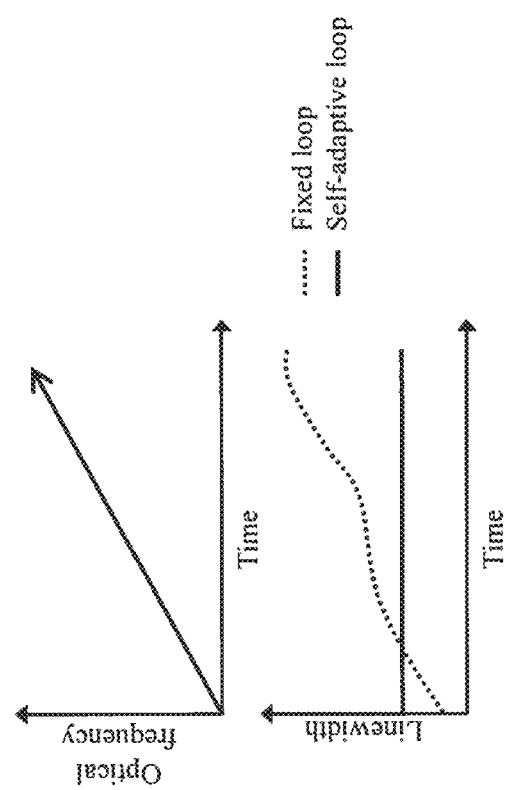
FIG. 3 is the linewidth change as a function of time during one-sided sweep using conventional fixed loop in comparison with using self-adaptive and time-dependent loop parameters.

(c) The loop parameters, such the loop bandwidth, gain, and the location of the poles/zeroes, are time-dependent and self-adaptive. The control unit 122 collects the phase error as a function of time in real-time from the PFD 114. The phase noise information is used to generate optimized loop parameters. The control unit 122 is programmed to analyze the time-dependent phase noise, find the optimized loop parameters, and update the loop controller 118, accordingly. It is worth noting that all the loop parameters are time-dependent, meaning that they can change their values within a single chirp, to optimize the performance of the SV-LLPG in terms of phase noise, or linearity/linewidth. Shown in FIG. 3, the self-adaptive and time-dependent loop holds the advantage to optimize the sweep velocity lock within the entire duration of a chirped pulse.

Figure 4:
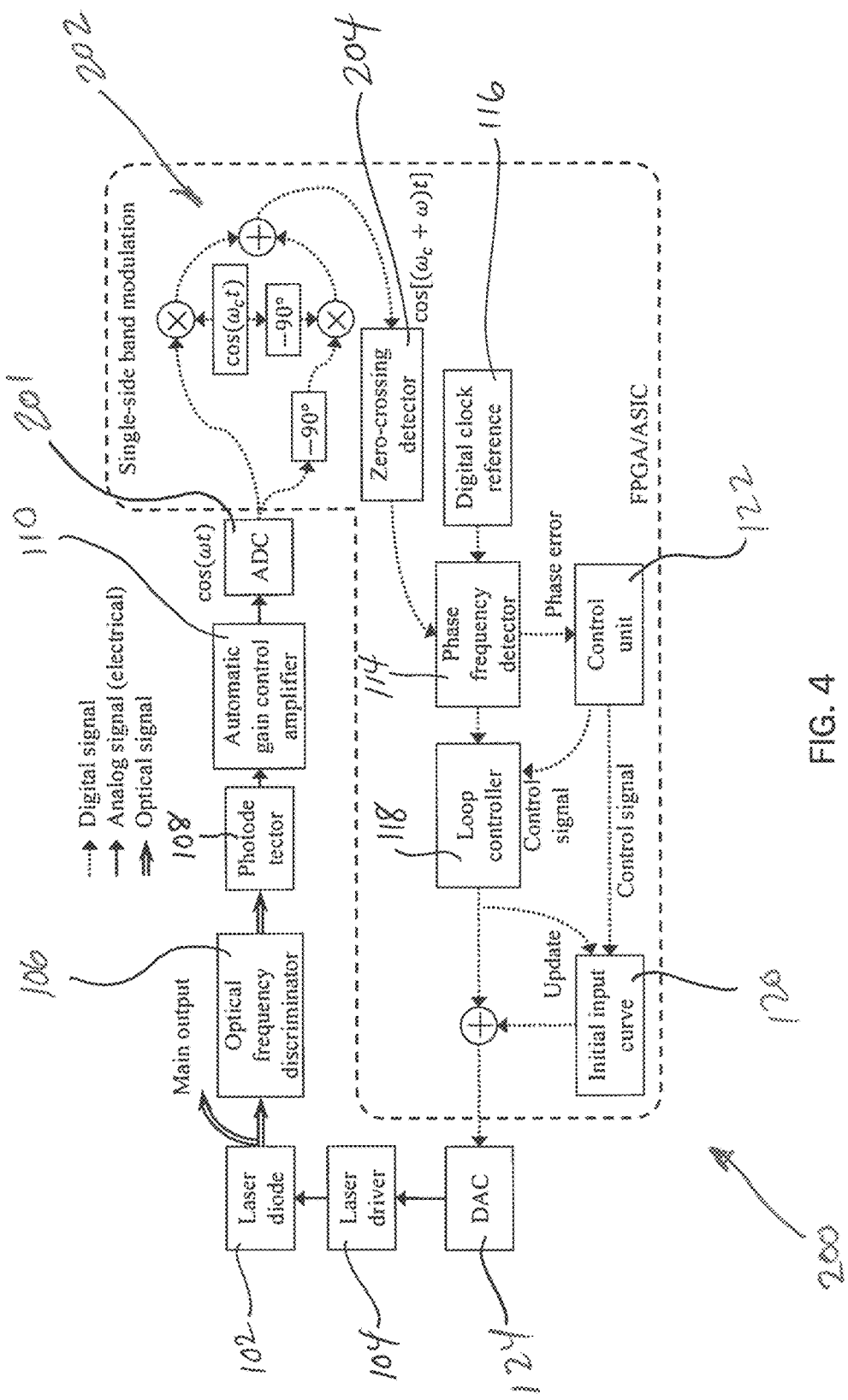
FIG. 4 is an exemplary architecture of SV-LLPG with improved coherent length via signal-side band (SSB) modulation method.

FIG. 4 depicts an exemplary architecture of an SV-LLPG generally indicated at 200 with improved coherent length via signal-side band (SSB) modulation method. The general configuration is similar to embodiment 100 with similar components with the exception of an Analog to Digital Converter (ADC) 201 at the output of the AGC 110. The key to improving coherence, or reducing linewidth of the laser output, is to mitigate the phase noise at broader bandwidth.

To do so, the loop bandwidth needs to be broadened. However, in the previous design, shown in FIG. 1, the loop bandwidth is limited by the bandwidth of the RF signal, which is typically ranging from a few tens of kHz to a few MHz.

In order to break this limit, a Single-Sideband (SBB) modulation module 202 is used to up-convert the RF signal from $\omega$ to $\omega+\omega_c$, where $\omega_c$ is the carrier frequency, which is at least 10 times higher than the RF signal frequency, $\omega$. The up-converted signal is fed into a zero-crossing detector 204 to produce a high-speed digital signal. Thus, the loop bandwidth of this architecture can be much broader than the RF signal frequency, $\omega$. The entire SSB modulation function can be built and integrated in the digital chip, shown in FIG. 4. Also, it is worth noting that the SSB modulation can be achieved using standard analog circuit as well.

Figure 5:
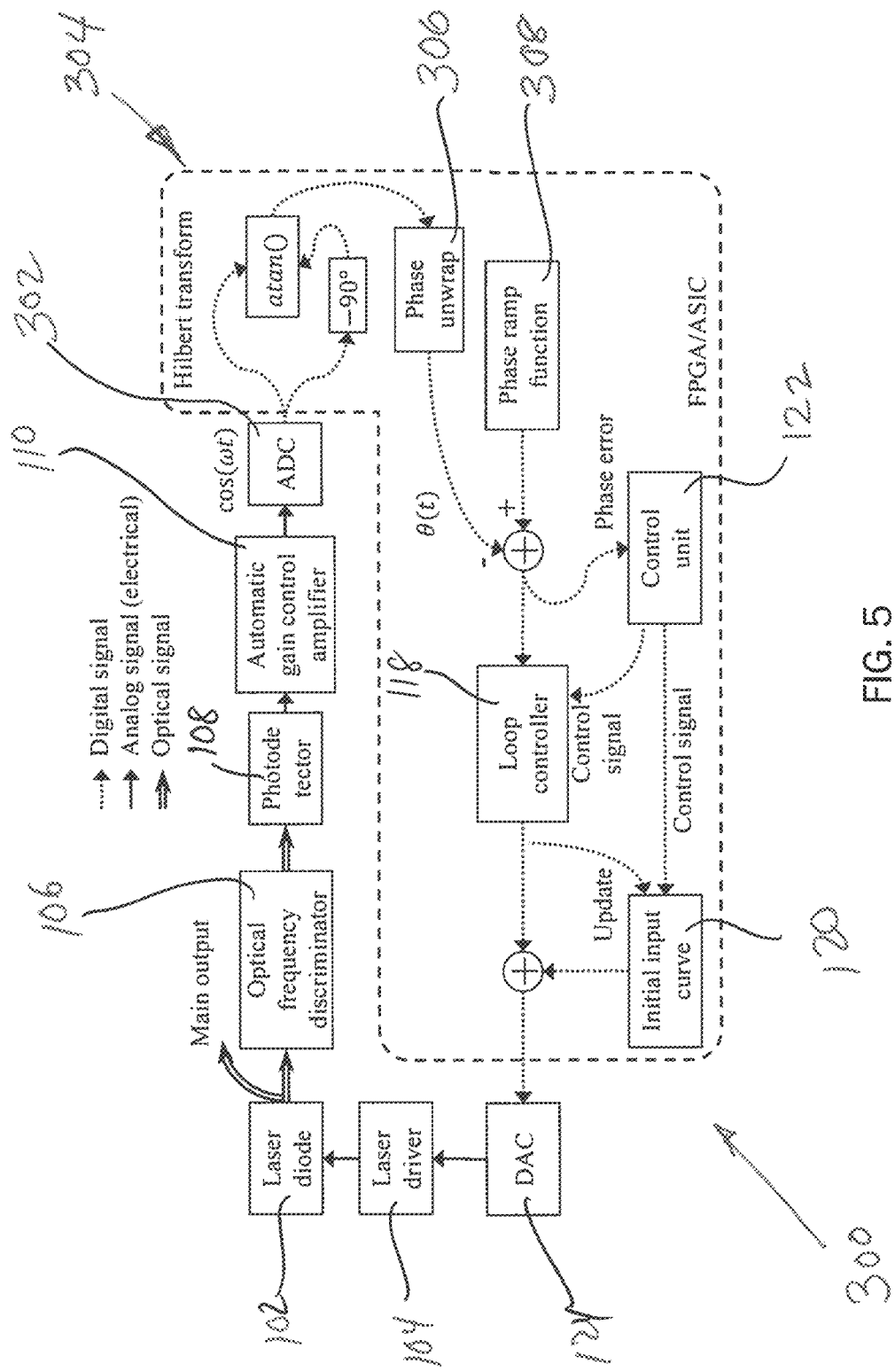
FIG. 5 is an exemplary architecture of SV-LLPG with improved coherent length via direct phase measurement (DPM) method.

FIG. 5 is an exemplary architecture of SV-LLPG generally indicated at 300 with improved coherent length via a direct phase measurement (DPM) method. The general configuration is similar to embodiment 200 with similar components. The essence of this method is also increasing the loop bandwidth of the SV-LLPG. The RF signal, captured by an analog-to-digital converter (ADC) 302, is Hilbert transformed 304 to output instantaneous phase as a function of time. The unwrapped phase 306 is locked to a linear progressive phase ramp function 308, or the reference signal (not shown), to achieve sweep velocity locking. The phase measurement sampling rate is the same as the master clock of the digital chip, which can easily reach 100 MHz. Thus, the loop bandwidth of this method is significantly larger than previously description SV-LLPG in FIG. 1.

Figure 6:
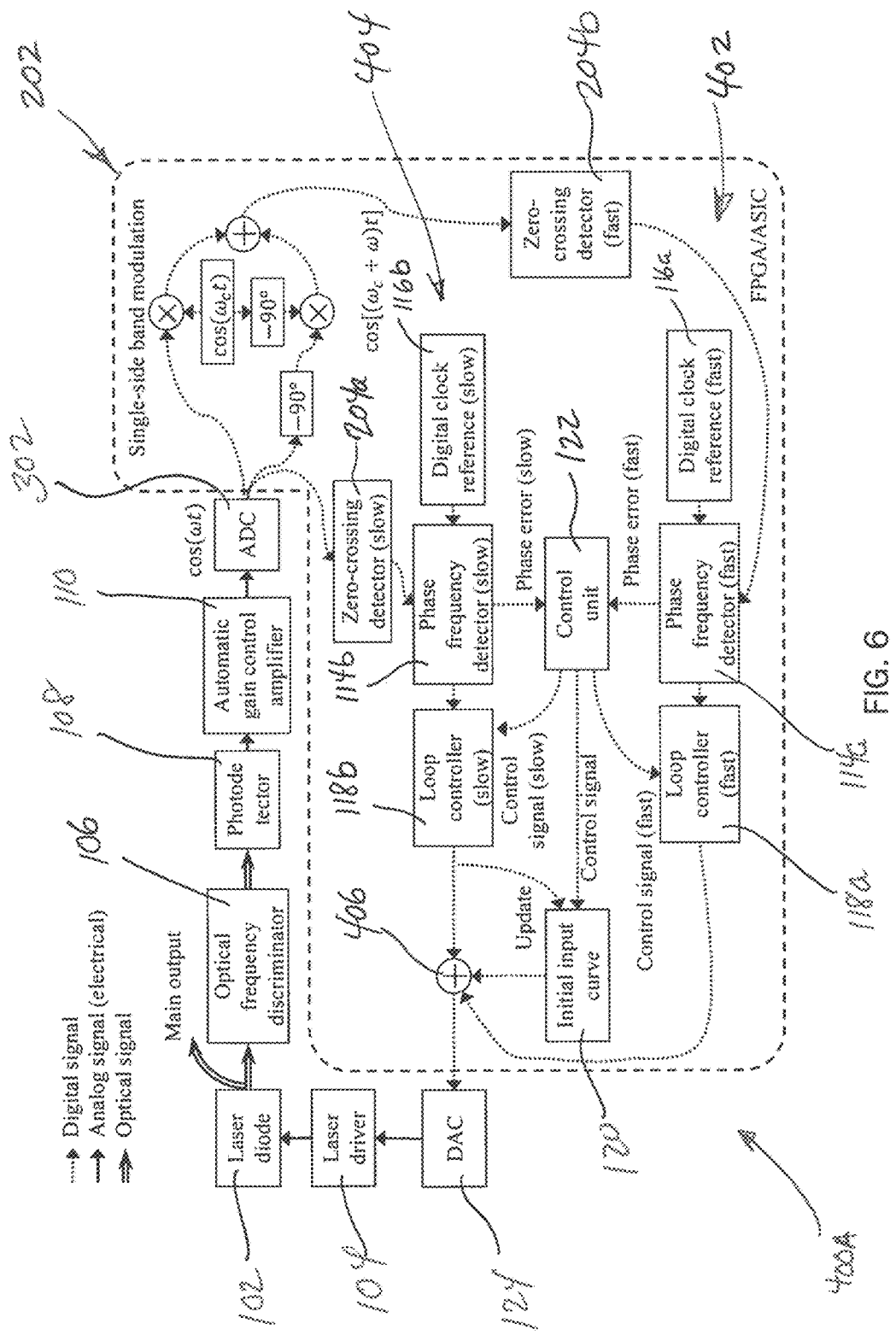
FIG. 6 is an exemplary architecture of SV-LLPG with improved coherent length via multiple loop locking method with digital loop combination (SSB modulation as fast loop)
Figure 7:
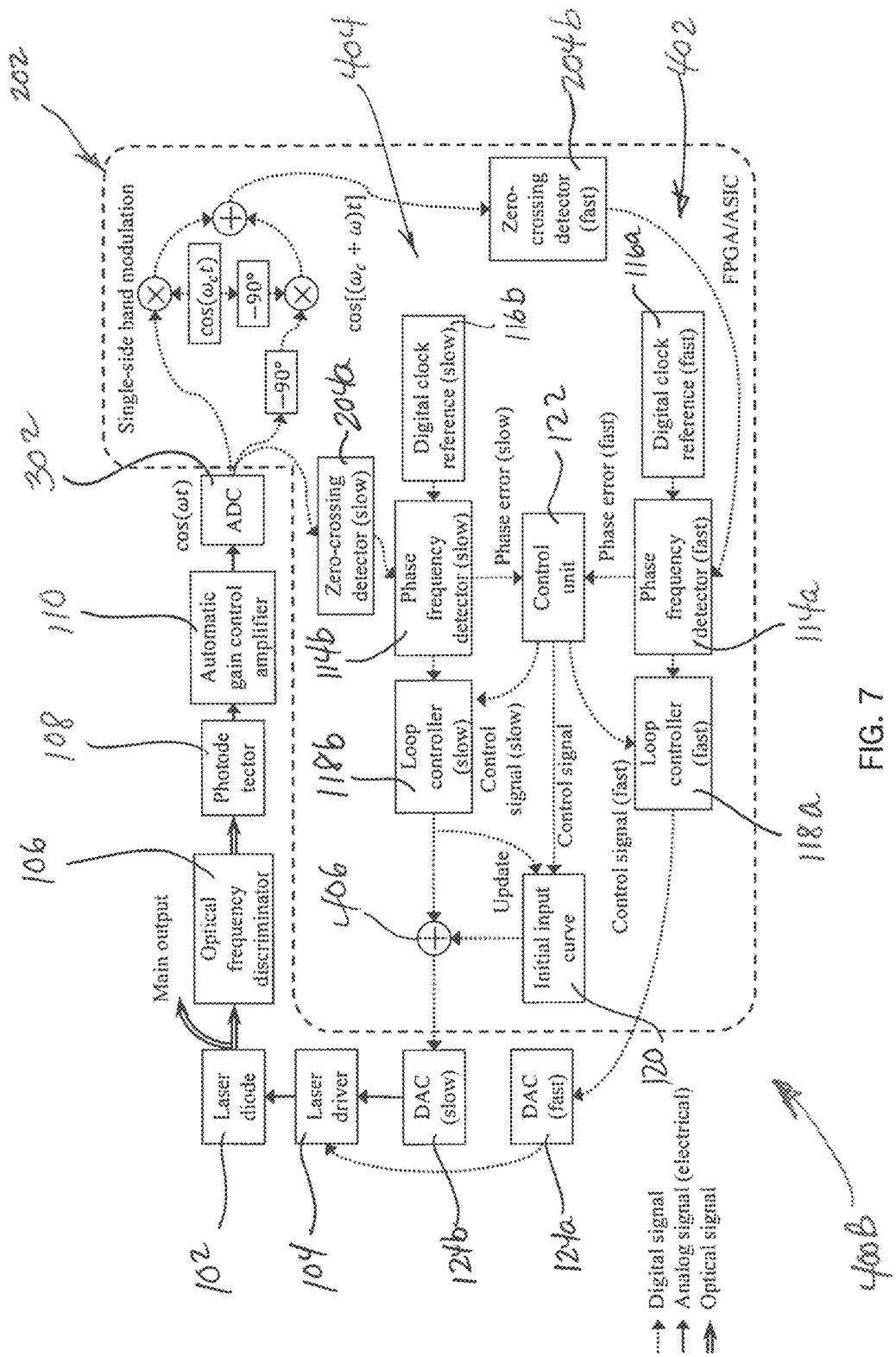
FIG. 7 is an exemplary architecture of SV-LLPG with improved coherent length via multiple loop locking method with analog loop combination (SSB modulation as fast loop)

FIG. 6 is an exemplary architecture of SV-LLPG generally indicated at 400 with improved coherent length via multiple loop locking method (SSB modulation 202 as fast loop). The general configuration is similar to embodiment 200 with similar components. This approach holds the advantage of simultaneously providing fast and slow servo control loops 402 and 404 to maximize the locking performance at both low frequency range and high frequency range. It is worth noting that the control loop signals from both the fast loop 402 and the slow loop 404 can be added together via a digital summator 406, shown in FIG. 6, or in an analog adder (not shown), or bias Tee (not shown), built in the laser driver 104, shown in FIG. 7. In the bias Tee configuration, there is a separate DAC 124 for each of the fast control loop 402 and the slow control loop 404.

Figure 8:
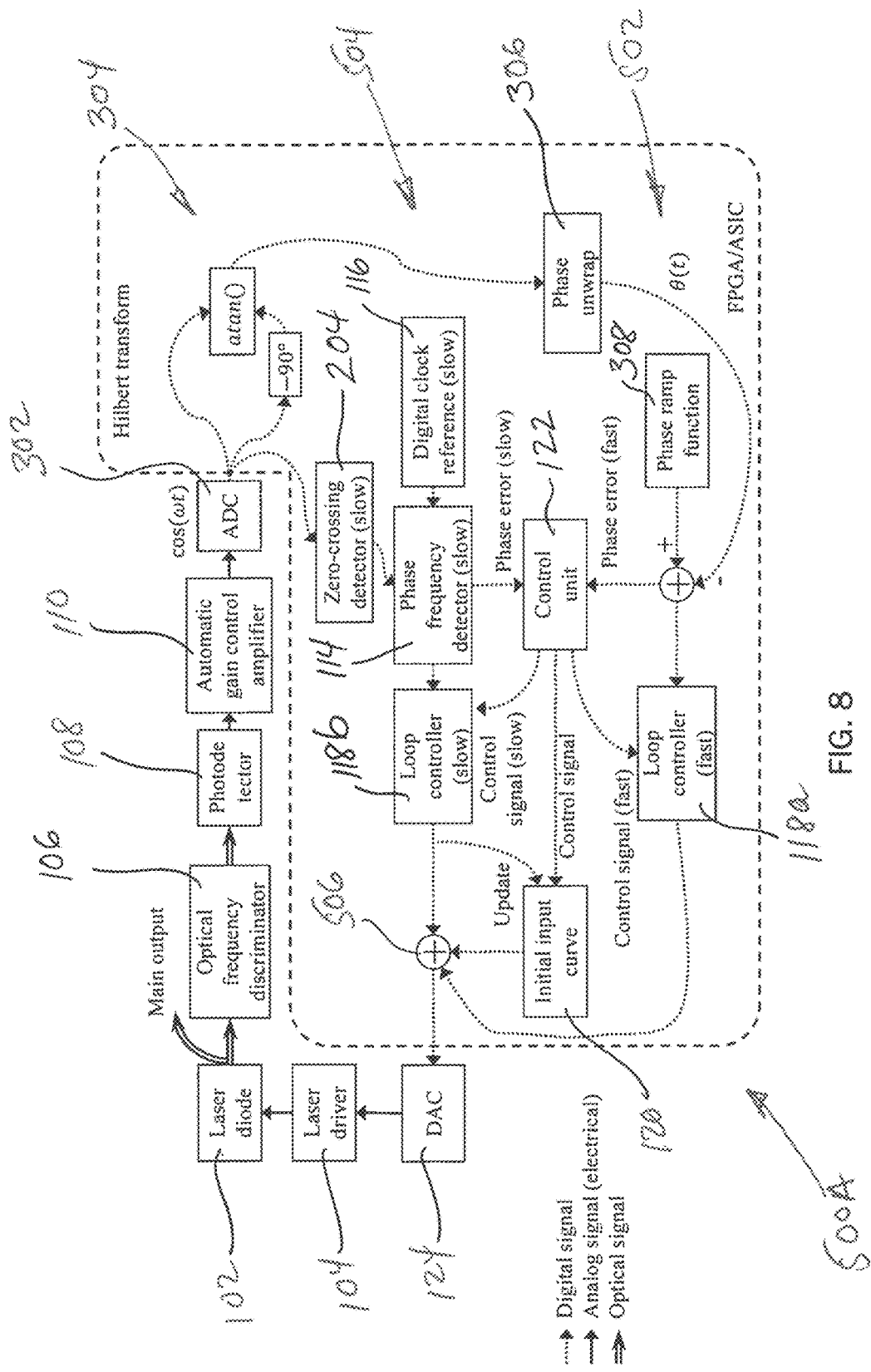
FIG. 8 is an exemplary architecture of SV-LLPG with improved coherent length via multiple loop locking method (DPM as fast loop) with digital loop combination.
Figure 9:
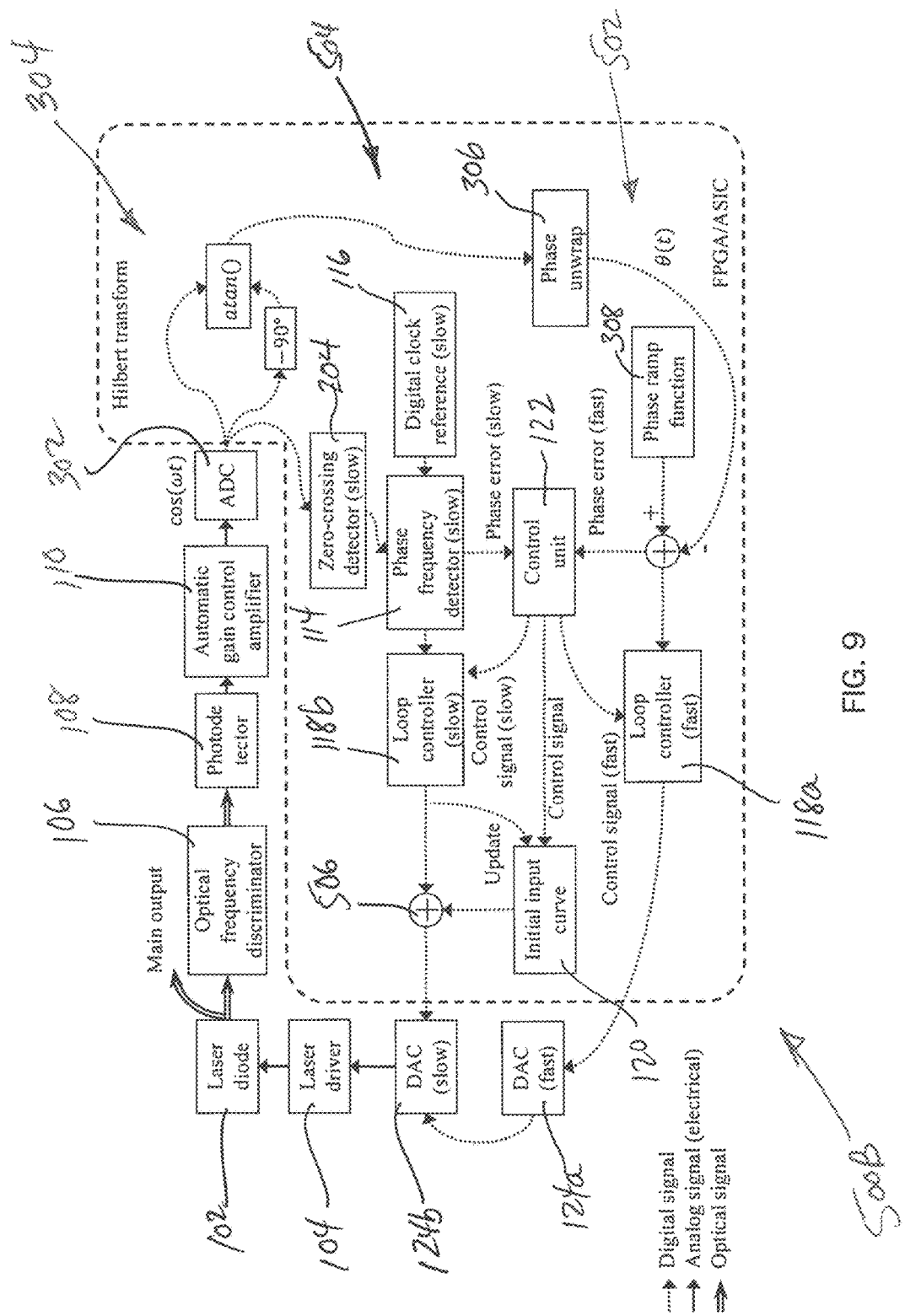
FIG. 9 is an exemplary architecture of SV-LLPG with improved coherent length via multiple loop locking method (DPM as fast loop) with analog loop combination.

FIG. 8 is an exemplary architecture of SV-LLPG generally indicated at 500 with improved coherent length via multiple loop locking method (DPM as fast loop). The general configuration is similar to embodiment 300 with similar components. This approach holds the advantage of simultaneously providing fast and slow servo control loops 502 and 504 to maximize the locking performance at both low frequency range and high frequency range. It is worth noting that the control loop signals from both fast loop 502 and slow loop 504 can be added together via a digital summator 506, shown in FIG. 8, or in an analog adder (not shown), or bias Tee 508, built in the laser driver 104, shown in FIG. 9. In the bias Tee configuration, there is a separate DAC 124 for each of the fast control loop 502 and the slow control loop 504.

It is worth noting that the number of loops in disclosed multi-loop architecture is not limited to two. Also, a series of combination of SSB modulation and DPM methods can be integrated to form multiple control loops.

Figure 10:
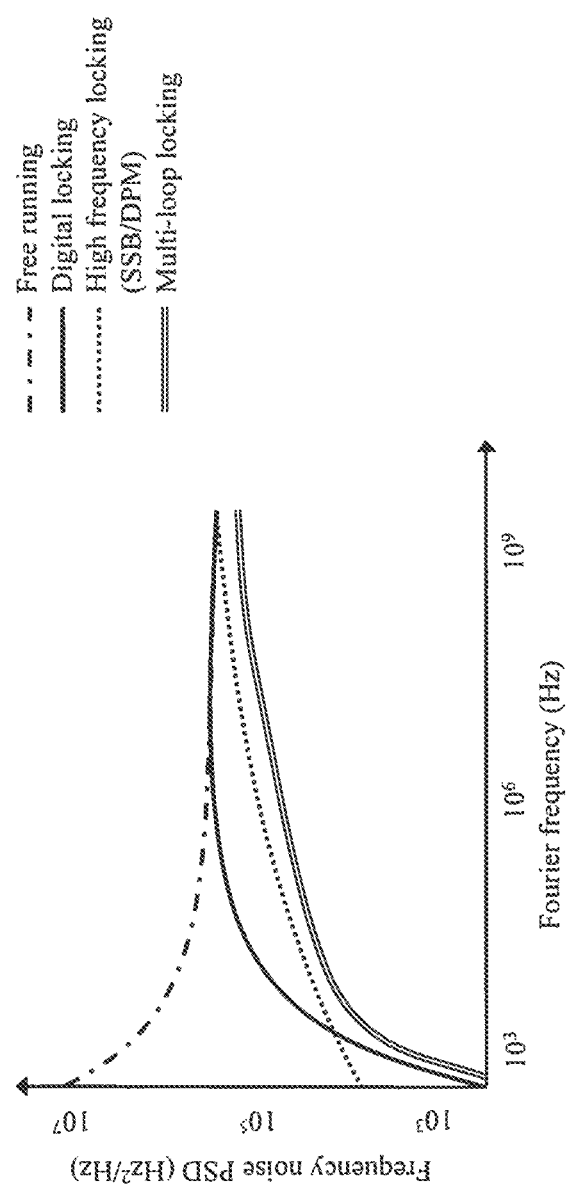
FIG. 10 is a comparison of the power spectrum density (PSD) of frequency noise of the chirped laser pulse using different methods, including free-running (open loop), digital SV-LLPG with self-adaptive loop parameters and self-adaptive initial input curve (FIG. 1), high frequency SV-LLPG (both SSB modulation method in FIG. 4 and DPM method in FIG. 5), and multi-loop architectures (FIG. 6-9)

FIG. 10 shows the power spectrum density (PSD) of frequency noise of the chirped laser pulse using different methods. Under free running operation mode, in which the control loop is open, the PSD of frequency noise is high, forming a Lorentz distribution. Under digital locking mode, described in FIG. 1, the low frequency portion of the PSD of frequency noise is suppressed, and the high frequency portion is left unchanged. Under high frequency locking operation, including both SSB modulation method in FIG. 4 and DPM method in FIG. 5, both low frequency and high frequency portions of the frequency noise PSD are suppressed simultaneously, leading to a much-reduced linewidth. Under multiple-loop operation, including both SSB type double loop in FIG. 6 and FIG. 7, and DPM type double loop in FIG. 8 and FIG. 9, both low frequency and high frequency portions are significantly suppressed, giving the best performance out of all disclosed architectures.

Turning now to FIG. 11-14, an exemplary embodiment of an improved initial input curve finder 600 for a semiconductor laser 602 is disclosed and described. The curve finder 600 is integrated into the laser pulse generator architecture and replaces the initial input curve unit 120 from FIG. 1.

The digitally integrated, self-trained pre-distortion curve finder for semiconductor lasers (SCLs) is generally indicated at 600. While applicable to any semiconductor laser, the pre-distortion curve finder 600 is effective in the context of the present disclosure to generate linear frequency-swept optical signals that are useful over a wide range of sweep velocities and semiconductor laser types. The architecture can be implemented on the same chip as the pulse generator. The operating methods require no prior knowledge of the frequency response of the laser 602 and are highly accurate.

As noted above, the objective of the present method and device is to quickly find the pre-distortion curve of the semiconductor laser 602 in the form of digital data so that it can be used immediately by the laser driver circuit 604 (LD) at startup to generate a high-quality linearized optical sweep without delay.

Figure 11:
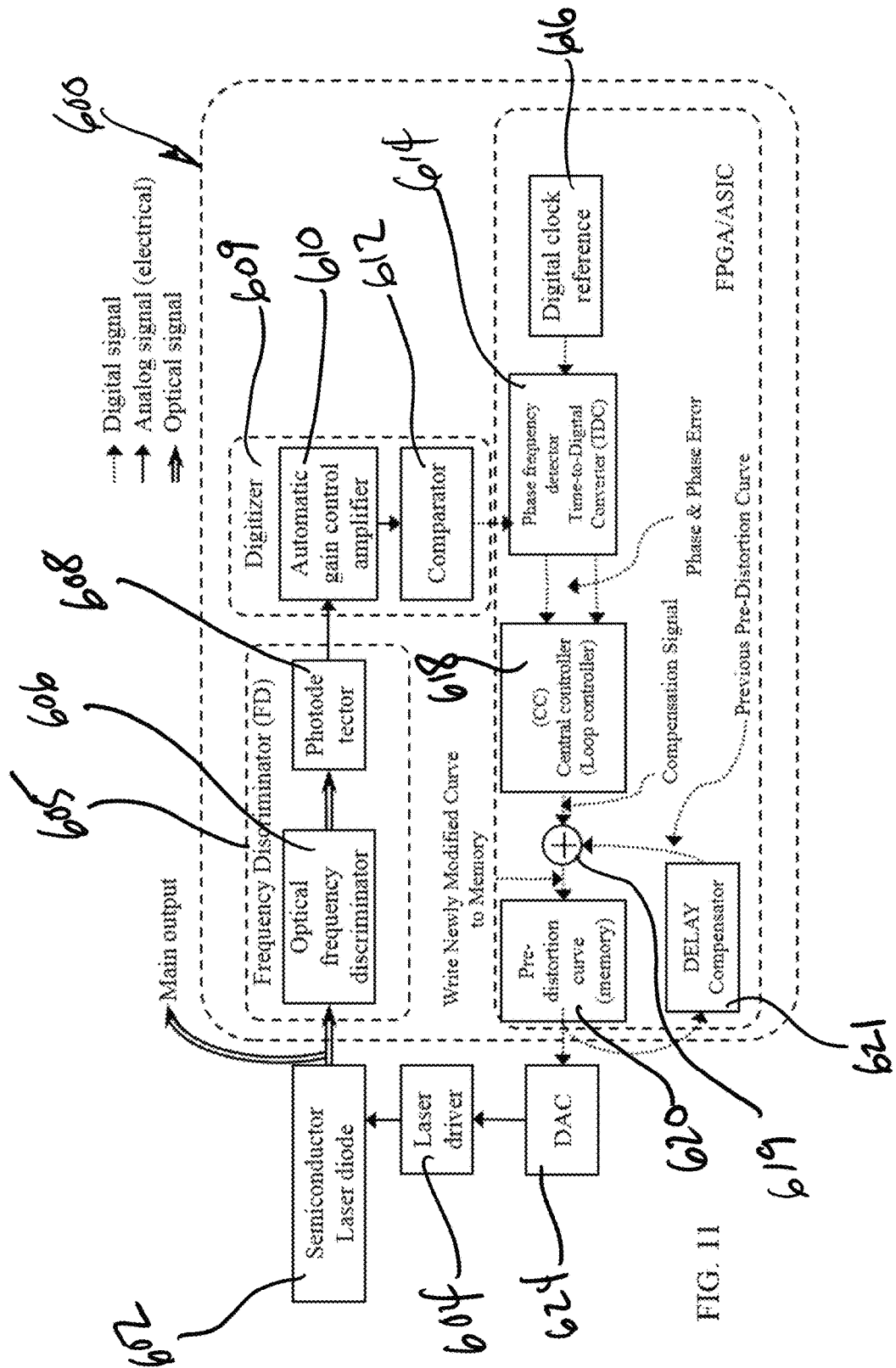
FIG. 11 is an exemplary architecture of a digitally integrated, self-trained pre-distortion curve finder for a semiconductor laser generally.

Referring to FIG. 11, a baseline or initial pre-distortion curve is stored in a memory 620 for use at laser startup. A small portion of the laser output from a Semiconductor Laser (SCL) 602 (or Laser Driver 604 and SCL 602) is delivered into a Frequency Discriminator (FD) 605 that converts the optical frequency sweep velocity into a radio frequency. This radio frequency is proportional with the optical frequency sweep velocity. In this architecture, the FD 605 is a combination of an optical interferometer 606 and a photodetector 608 (either single-end or balanced) (similar to FIG. 1), or it can alternatively be a combination of an optical resonator and photodetector (either single-end or balanced).

The radio frequency created by the FD 605 is converted into a digital signal through the use of a digitizer 609, which comprises an automatic gain control amplifier (AGC) 610 and a comparator 612 (also similar to FIG. 1). The digitizer 609 can be an electronic comparator, or an analog-to-digital converter (ADC).

The digitized signal is then fed into a Time-to-Digital Converter (TDC), also known as a Phase Frequency Detector 614, which is able to generate the precise phase and frequency error between the digitized signal input, and the expected signal with a constant frequency. Digital clock reference 616 provides a timing reference. It is worth noting that the expected constant frequency is linearly proportional with laser frequency sweep velocity. This constant frequency is dialed into the TDC module before the training process.

The frequency and frequency error are then fed into a Central Controller (CC) 618 (or loop controller), which has two main functions. The first function is to generate a compensation signal to modify the pre-distortion curve through iterations, also known as training. This compensation signal generator is built as a digital filter, and it can be as simple as a digital integrator. The second function is to count the number of iterations. The iteration number and the coefficients of the digital filter are pre-set before the training process.

The compensation signal is then summed up with a delayed version of pre-distortion curve (described below) from the previous training iteration via a digital adder 619. The newly modified pre-distortion curve is then written into the memory 620 to re-define the pre-distortion curve used by the laser driver 604.

The delayed version of the pre-distortion curve is captured through the use of a delay Delay compensator 621. The purpose of this delay compensator unit is to compensate the loop delay, including both analog and digital delay in the iteration/training loop. The length of delay, with a unit of number of system clock cycles, is pre-set into the Delay compensator before the training process.

A Digital to Analog Converter (DAC) 624 reads the curve data from the memory 620 to generate a newly modified pre-distortion curve from the current iteration during the training process.

Each iteration of the feedback loop takes on 1 ms to complete, and a 1000 iterations, only 1 second, providing an almost instantaneous stable laser source.

Figure 12:
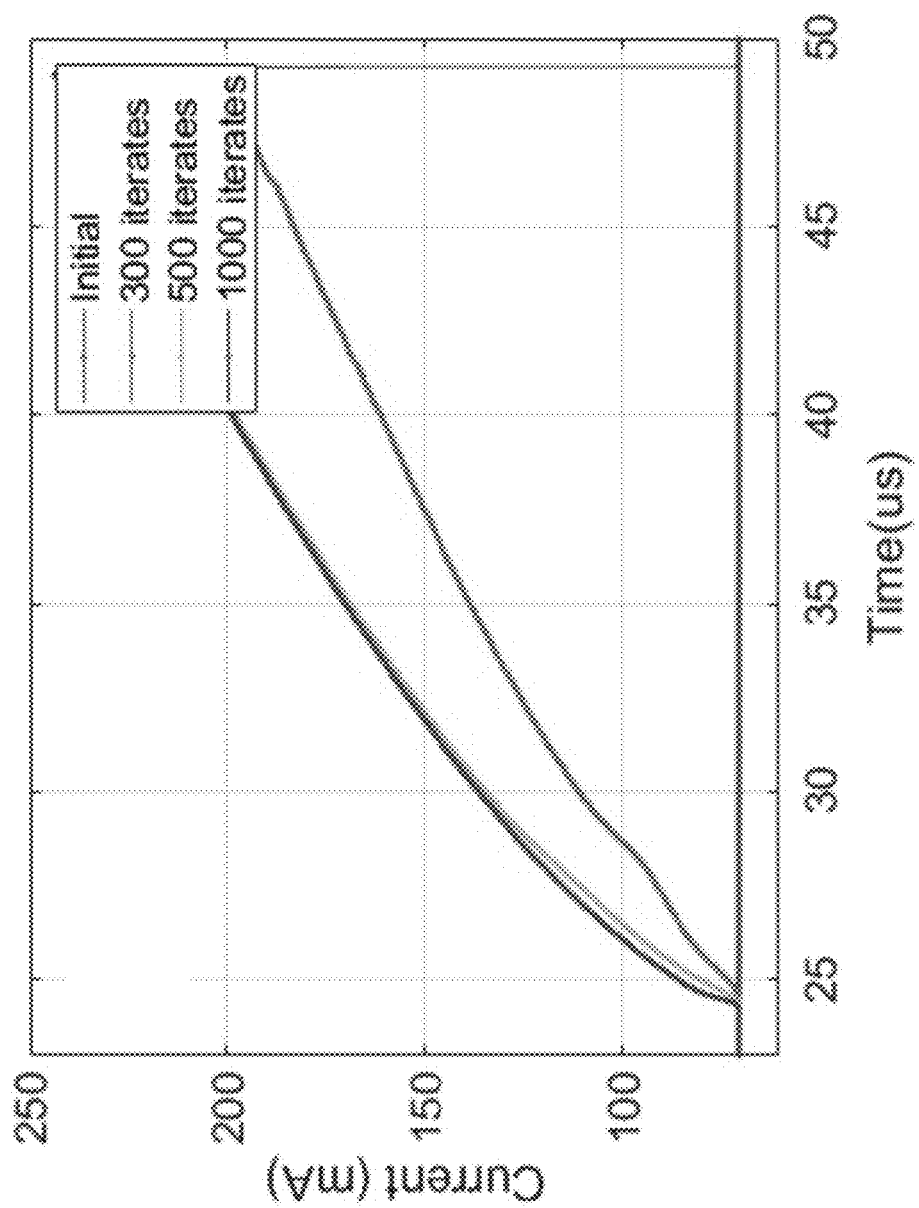
FIG. 12 is a plot of pre-distortion curves after 300, 500 and 1000 feedback iterations.
Figure 13:
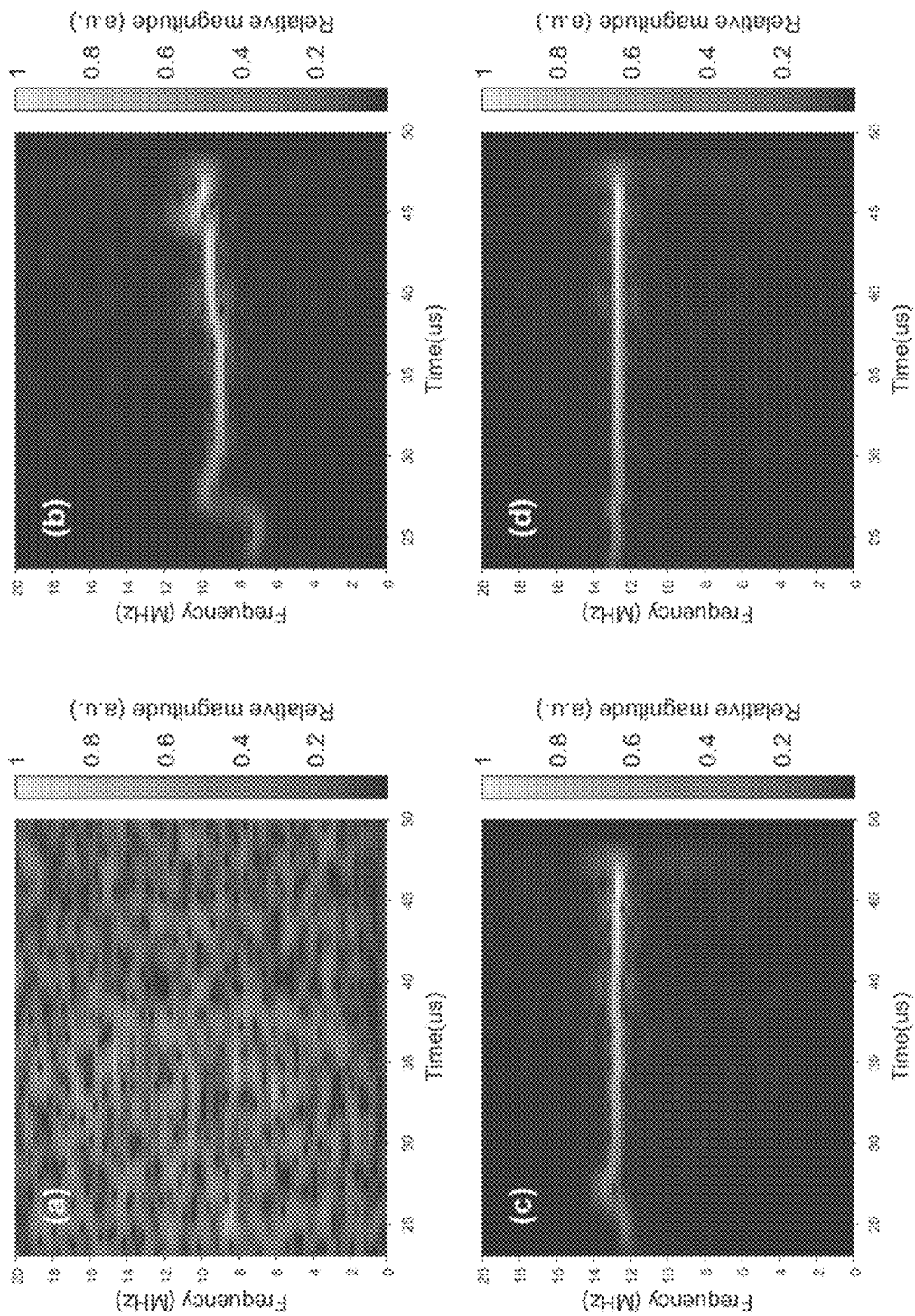
FIG. 13 illustrates short-time FFT results with different iterating curves; (a) initial current value at time 0; (b) at 300 iterating results; (c) at 500 iterating results; and (d) at 1000 iterating results.

FIG. 12 shows the pre-distortion curves during the entire training process as an example FIG. 13 shows the short time FFT of the FD output corresponding to different pre-distortion curves shown in the FIG. 2 at different iteration numbers. As training process advances, the radio frequency output from FD is becoming a constant during the sweep duration, indicating a more linearly frequency sweep. This results clearly shows the effectiveness of this method.

Figure 14:
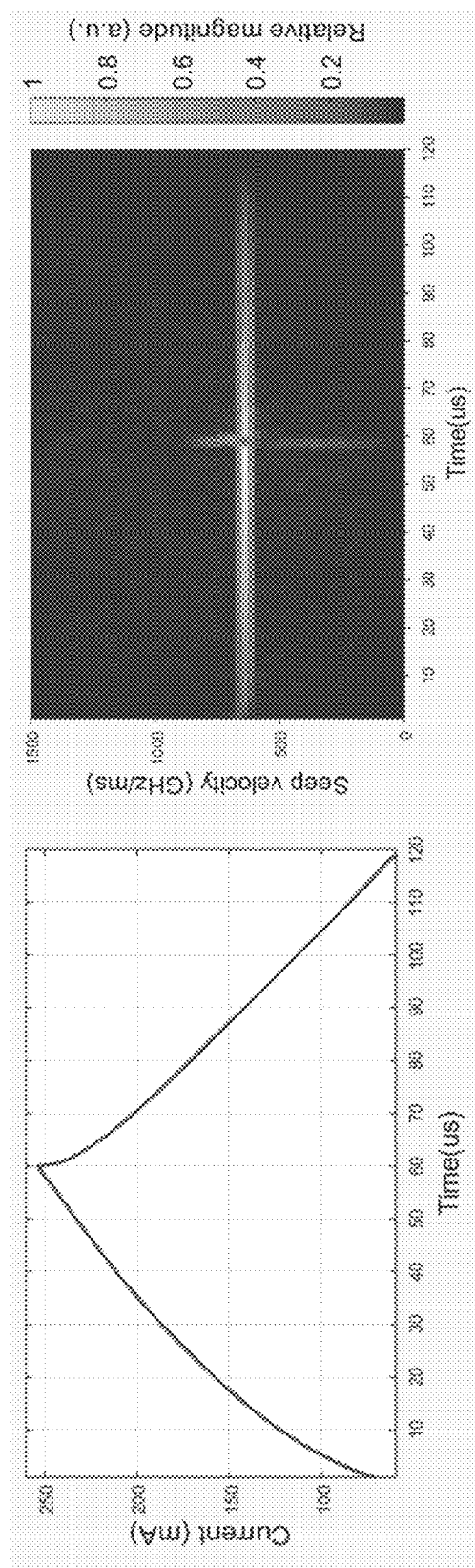
FIG. 14 illustrates a short time FFT results of a double-sided linearized frequency sweep, trained by the pre-distortion curve finder of the present invention.

Referring to FIG. 14, by changing the sign of the output of the TDC periodically, the pre-distortion curve finder can be used to generate double-sided linearized frequency sweeps. The left side of FIG. 14 shows the trained predistortion curve, while the right side shows the short time FFT of the FD output, correspondingly. During the first sweep duration, the optical frequency linearly decreases at a constant sweep speed, while during the second sweep duration, the optical frequency linearly increases at a constant sweep speed. The benefit of double-sided linearized frequency sweep is that both up and down sweep can be used, enabling a high spectrum measurement speed.

The present pre-distortion curve finder can function as a stand-alone unit or can be integrated into swept-velocity locked laser pulse generators as also disclosed in various exemplary embodiments herein.

Figure 15:
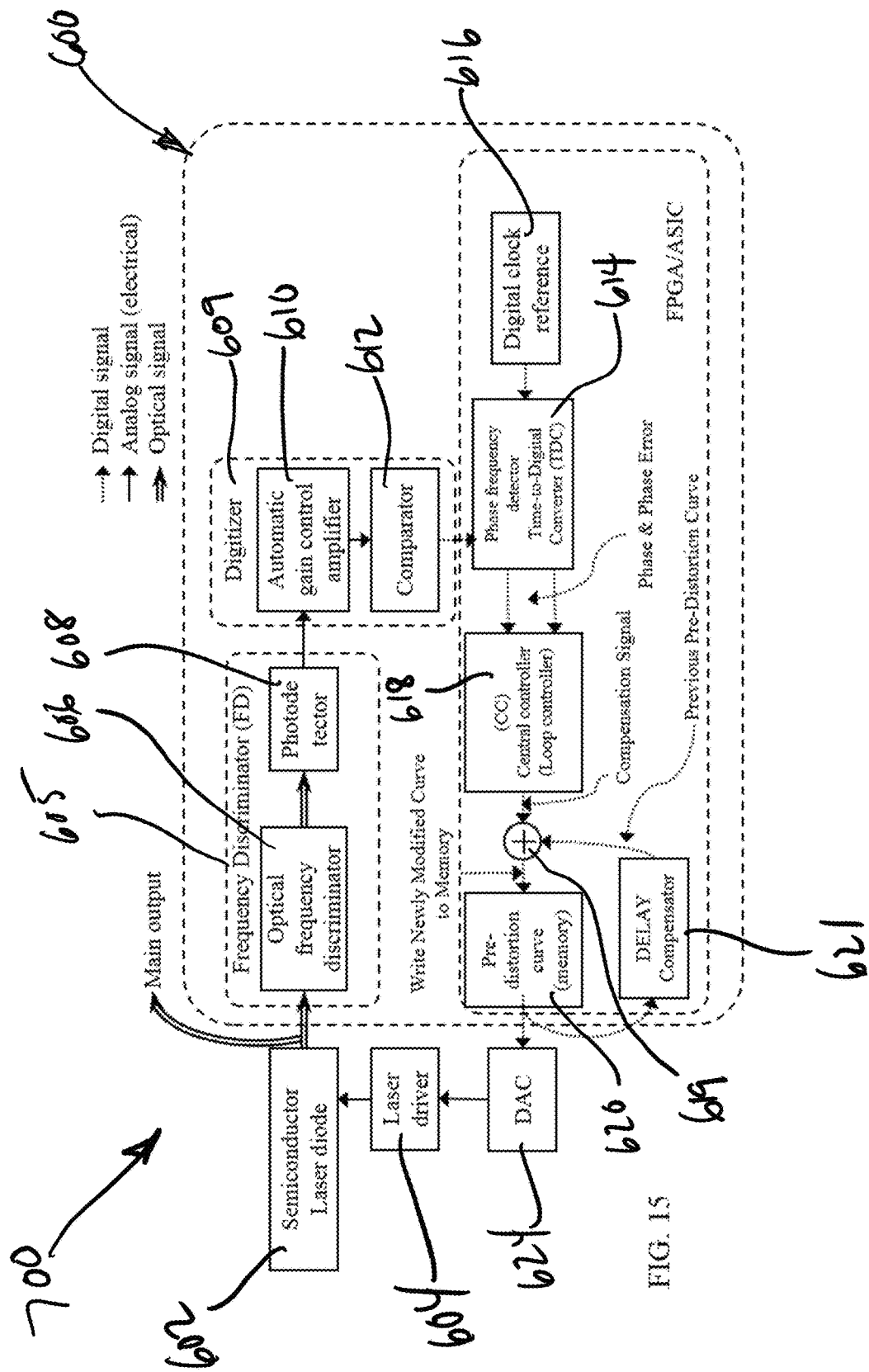
FIG. 15 is an exemplary architecture of a digital sweep velocity-locked laser pulse generator (SV-LLPG) (same as FIG. 1) with the pre-distortion curve finder of the present invention digitally integrated therewith.

Referring to FIG. 15, the subject pre-distortion curve finder 600 is integrated into a similar sweep-velocity locked laser pulse generator (SV-LLPG) 700 as described hereinabove in FIG. 1. As noted above, the pre-distortion curve finder architecture 600 is integrated with the same components as the laser pulse generator 700.

It can therefore be seen that the exemplary embodiments provide a set of unique and novel advancements, which have substantial potential as a series of low-cost and high-performance, laser architectures to substantially simplify finding the pre-distortion curve of any semiconductor laser as well as reduce the linewidth of SV-LLPG in a purely electronic way. This invention will directly benefit applications, such as FMCW LiDAR and OFDR distributed fiber optic sensing applications, by significantly extending their measurement ranging at a minimum cost.

While there is shown and described herein certain specific structures embodying various embodiments of the invention, it will be manifest to those skilled in the art that various modifications and rearrangements of the parts may be made without departing from the spirit and scope of the underlying inventive concept, and that the same is not limited to the particular forms herein shown and described except insofar as indicated by the scope of the appended claims.

What is claimed is:

1. A pre-distortion curve finder for a frequency-swept semi-conductor laser comprising:
    a baseline pre-distortion curve stored in a memory;
    an optical frequency discriminator (OFD) receiving an optical signal from said semiconductor laser and outputting an analog RF signal linearly proportional to the sweep velocity;
    a digitizer receiving output from said OFD and converting said output into digital signals;
    a digital phase frequency detector (PFD) receiving said digital signals from said digitizer, and generating an expected digital signal phase and a digital phase error signal;
    a central loop controller receiving said expected digital phase signal and said digital phase error signal and generating a compensation signal to modify said baseline pre-distortion curve through a plurality of iterations, said loop controller counting iterations of digitized signals received;
    a digital adder receiving said compensation signal;
    a delay compensation loop providing a delayed version of said pre-distortion curve from a previous compensation iteration,
    wherein said delayed version of said previous predistortion curve is summed with said current compensation signal to generate a newly modified pre-distortion curve which is written to said memory, and
    wherein the laser diode is driven based on the newly modified iterative version of said pre-distortion curve stored in memory.

2. The pre-distortion curve finder of claim 1, wherein said OFD includes a photodetector.

3. The pre-distortion curve finder of claim 1, wherein said digitizer comprises an automatic grain control amplifier (AGC) and a comparator.

4. The pre-distortion curve finder of claim 1 wherein the loop controller is configured and arranged to cycle through at least 300 iterations.

5. The predistortion curve finder of claim 1 wherein the loop controller is configured and arranged to generate a new compensation signal every 1 ms.

6. The predistortion curve finder of claim 5 wherein the loop controller is configured and arranged to generate a compensation signal every 1 ms.

7. A linearly frequency swept semiconductor laser, comprising:
    a laser diode;
    a laser driver circuit operating the laser diode;
    a baseline pre-distortion curve stored in a memory;
    an optical frequency discriminator (OFD) receiving an optical signal from said semiconductor laser and outputting an analog RF signal linearly proportional to the sweep velocity;
    a digitizer receiving output from said OFD and converting said output into digital signals;

a digital phase frequency detector (PFD) receiving said digital signals from said digitizer, and generating an expected digital signal phase and a digital phase error signal;

a central loop controller receiving said expected digital phase signal and said digital phase error signal and generating a compensation signal to modify said baseline pre-distortion curve through iterations, said loop controller further counting iterations of digitized signals received;

a digital adder receiving said compensation signal;

a delay compensation loop proving a delayed version of said pre-distortion curve from a previous compensation iteration, wherein said delayed version of said previous predistortion curve is summed with said current compensation signal to generate a newly modified pre-distortion curve which is written to said memory, and wherein the laser driver circuit uses the newly modified iterative version of said pre-distortion curve stored in memory to drive said laser diode.

8. The semiconductor laser of claim 7, wherein said OFD includes a photodetector.

9. The semiconductor laser of claim 7, wherein said digitizer comprises an automatic grain control amplifier (AGC) and a comparator.

10. The semiconductor laser of claim 7 wherein the loop controller is configured and arranged to cycle through at least 300 iterations.

11. The semiconductor laser of claim 7 wherein the loop controller is configured and arranged to generate a new compensation signal every 1 ms.

12. The semiconductor laser of claim 11 wherein the loop controller is configured and arranged to generate a compensation signal every 1 ms.

13. A method of finding the pre-distortion curve of a semiconductor laser comprising the steps of:

driving a semiconductor laser diode to generate an optical output;

storing a baseline pre-distortion curve store in a memory;

receiving an optical signal from said semiconductor laser and outputting an analog RF signal linearly proportional to a sweep velocity;

receiving output from said OFD and converting said output into digital signals;

receiving said digital signals and generating an expected digital signal phase and a digital phase error signal;

receiving said expected digital phase signal and said digital phase error signal and generating a compensation signal to modify said baseline pre-distortion curve;

providing a delayed version of said pre-distortion curve from a previous compensation iteration, summing said delayed version of said previous predistortion curve with said current compensation signal to generate a newly modified pre-distortion curve;

writing said newly modified pre-distortion curve to said memory; and driving said semiconductor laser diode to generate an optical output using the newly modified iterative version of said pre-distortion curve stored in memory.

14. The method of claim 13, wherein said steps of generating a compensation signal, providing said delayed version of said pre-distortion curve from the previous iteration, summing the delayed version with the compensation signal and generating a newly modified pre-distortion curve is repeated every 1 ms.

15. The method of claim 13, wherein the steps of generating a compensation signal, providing said delayed version of said pre-distortion curve from the previous iteration, summing the delayed version with the compensation signal and generating a newly modified pre-distortion curve is repeated every 1 ms for at least 300 iterations.

16. The method of claim 13, wherein the steps of generating a compensation signal, providing said delayed version of said pre-distortion curve from the previous iteration, summing the delayed version with the compensation signal and generating a newly modified pre-distortion curve is repeated every 1 ms for at least 500 iterations.

17. The method of claim 13, wherein the steps of generating a compensation signal, providing said delayed version of said pre-distortion curve from the previous iteration, summing the delayed version with the compensation signal and generating a newly modified pre-distortion curve is repeated every 1 ms for at least 1000 iterations.

* * * * *